United States Patent
Nishio et al.

(10) Patent No.: US 10,312,330 B2
(45) Date of Patent: Jun. 4, 2019

(54) METHOD FOR FABRICATING SEMICONDUCTOR SUBSTRATE, SEMICONDUCTOR SUBSTRATE, AND SEMICONDUCTOR DEVICE

(71) Applicant: Kabushiki Kaisha Toshiba, Minato-ku (JP)

(72) Inventors: Johji Nishio, Machida (JP); Ryosuke Iijima, Setagaya (JP); Kazuto Takao, Tsukuba (JP); Takashi Shinohe, Yokosuke (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/905,984

(22) Filed: Feb. 27, 2018

(65) Prior Publication Data

US 2018/0190775 A1    Jul. 5, 2018

Related U.S. Application Data

(62) Division of application No. 14/614,699, filed on Feb. 5, 2015, now Pat. No. 9,941,361.

(30) Foreign Application Priority Data

Mar. 19, 2014 (JP) .................................. 2014-057283

(51) Int. Cl.
| | | |
|---|---|---|
| H01L 29/16 | (2006.01) | |
| H01L 21/02 | (2006.01) | |
| H01L 21/265 | (2006.01) | |
| H01L 29/32 | (2006.01) | |
| H01L 29/66 | (2006.01) | |
| H01L 29/861 | (2006.01) | |

(Continued)

(52) U.S. Cl.
CPC ...... *H01L 29/1608* (2013.01); *H01L 21/0262* (2013.01); *H01L 21/02378* (2013.01);
(Continued)

(58) Field of Classification Search
CPC .......... H01L 29/1608; H01L 21/02529; H01L 29/66068; H01L 21/02378; H01L 21/0262;
(Continued)

(56) References Cited

U.S. PATENT DOCUMENTS

7,737,011 B2    6/2010  Tsuchida et al.
2006/0137600 A1*   6/2006  Ellison .............. H01L 29/66068
                                              117/19

(Continued)

FOREIGN PATENT DOCUMENTS

| JP | 2004-352537 | 12/2004 |
| JP | WO2007/032214 A1 | 3/2007 |

(Continued)

OTHER PUBLICATIONS

Luitauras et al. "Reduction of traps . . . in 4H—SiC by ion implantation".*

(Continued)

*Primary Examiner* — Tony Tran
(74) *Attorney, Agent, or Firm* — Oblon, McClelland, Maier & Neustadt, L.L.P.

(57) ABSTRACT

In a method for fabricating a semiconductor substrate according to an embodiment, an SiC substrate is formed by vapor growth and C (carbon) is introduced into the surface of the SiC substrate to form an n-type SiC layer on the SiC substrate by an epitaxial growth method.

3 Claims, 8 Drawing Sheets

(51) Int. Cl.
  *H01L 21/04* (2006.01)
  *H01L 29/739* (2006.01)
(52) U.S. Cl.
  CPC .. *H01L 21/02433* (2013.01); *H01L 21/02447* (2013.01); *H01L 21/02529* (2013.01); *H01L 21/02576* (2013.01); *H01L 21/02658* (2013.01); *H01L 21/0445* (2013.01); *H01L 21/26506* (2013.01); *H01L 29/32* (2013.01); *H01L 29/6606* (2013.01); *H01L 29/66068* (2013.01); *H01L 29/8613* (2013.01); *H01L 29/7395* (2013.01)
(58) Field of Classification Search
  CPC ............. H01L 29/7869; H01L 27/1225; H01L 2924/0002; H01L 29/78696
  See application file for complete search history.

(56) References Cited

U.S. PATENT DOCUMENTS

| | | | |
|---|---|---|---|
| 2006/0267022 A1* | 11/2006 | Mizukami | H01L 29/66068 257/77 |
| 2009/0224284 A1 | 9/2009 | Nemoto | |
| 2009/0317983 A1 | 12/2009 | Miyanagi et al. | |
| 2010/0173475 A1 | 7/2010 | Tsuchida et al. | |
| 2013/0126906 A1 | 5/2013 | Tomita et al. | |
| 2014/0034966 A1 | 2/2014 | Nishio et al. | |
| 2015/0270128 A1 | 9/2015 | Nishio et al. | |

FOREIGN PATENT DOCUMENTS

| | | |
|---|---|---|
| JP | 2008-53667 A | 3/2008 |
| JP | 2009-49045 | 3/2009 |
| JP | 2009-188336 | 8/2009 |
| JP | 2015-179781 A | 10/2015 |
| WO | 2011/142074 A1 | 11/2011 |

OTHER PUBLICATIONS

Liutauras Storasta, et al., "Reduction of traps and improvement of carrier lifetime in 4H—SiC epilayers by ion implantation", Applied Physics Letters, vol. 90, pp. 062116-1-062116-3 (2007).

* cited by examiner

METHOD FOR FABRICATING SEMICONDUCTOR SUBSTRATE, SEMICONDUCTOR SUBSTRATE, AND SEMICONDUCTOR DEVICE

CROSS-REFERENCE TO RELATED APPLICATION

This application is based upon and claims the benefit of priority from Japanese Patent Application No. 2014-057283, filed on Mar. 19, 2014, the entire contents of which are incorporated herein by reference.

FIELD

Embodiments described herein relate generally to a method for fabricating a semiconductor substrate, a semiconductor substrate, and a semiconductor device.

BACKGROUND

SiC (silicon carbide) is expected as a material for next-generation semiconductor devices. Compared with Si (silicon), SiC has superior physical properties such as three times the band gap, about 10 times the breakdown field strength, and about three times the thermal conductivity. By making use of such properties, high-breakdown and low-loss semiconductor devices capable of operating at high temperature can be realized.

On the other hand, n-type SiC has a disadvantage of a short life time of minority carriers. With a short life time of minority carriers, it is difficult to reduce an on resistance of bipolar devices using n-type SiC as a drift layer.

DETAILED DESCRIPTION

Figure 1:
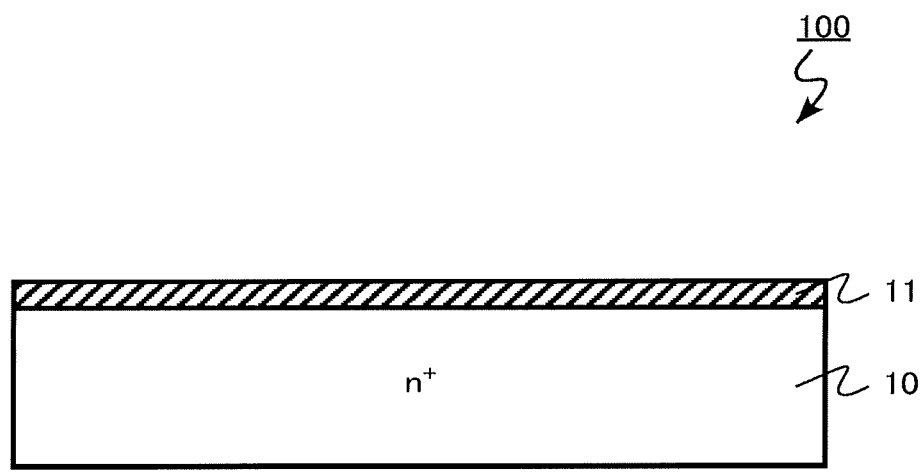
FIG. 1 is a schematic sectional view of a semiconductor substrate according to a first embodiment.

In a method for fabricating a semiconductor substrate according to an embodiment, an SiC substrate is formed by vapor growth and C (carbon) is introduced into the surface of the SiC substrate to form an n-type SiC layer on the SiC substrate by an epitaxial growth method.

Hereinafter, embodiments will be described with reference to the drawings. In the description that follows, the same reference numerals are attached to the same members and so on and a description of a member or the like described once is omitted when appropriate.

Also in the description that follows, $n^+$, n, and $n^-$ and $p^+$, p, and $p^-$ indicate the relative level of impurity concentration of each conductive type. That is, $n^+$ indicates that the n-type impurity concentration thereof is higher than n and $n^-$ indicates that the n-type impurity concentration thereof is lower than n. Also, $p^+$ indicates that the p-type impurity concentration thereof is higher than p and $p^-$ indicates that the p-type impurity concentration thereof is lower than p. Incidentally, the $n^+$ type and the $n^-$ type may simply be written as the n type and the $p^+$ type and the $p^-$ type may simply be written as the p type.

First Embodiment

A semiconductor substrate according to the present embodiment includes an SiC substrate having a region in which the $Z_{1/2}$ level density measured by DLTS (Deep Level Transient Spectroscopy) is $1\times10^{11}$ cm$^{-3}$ or less. The expression "$Z_{1/2}$ level density" (also referred to as the "$Z_{1/2}$ center") is known to those of ordinary skill in the art as evidenced by Kawahara et al., *Investigation on origin of $Z_{1/2}$ center in SiC by deep level transient spectroscopy and electron paramagnetic resonance*, APPL. PHYS. LETT. 102, 112106 (2013), Danno et al., *Investigation of carrier lifetime in 4H-SiC epilayers and lifetime control by electron irradiation*, APPL. PHYS. LETT. 90, 202109 (2007). Klein et al., *Lifetime-limiting defects in n$^-$ 4H-SiC epilayers*. APPL. PHYS. LETT. 88, 052110 (2006), and T. Dalibor et al., *Deep Defect Centers in Silicon Carbide Monitored with Deep Level Transient Spectroscopy*, Phys. Status Solidi A 162, 199-255 (1997).

FIG. 1 is a schematic sectional view of a semiconductor substrate according to the present embodiment. A semiconductor substrate 100 is an SiC substrate 10. The SiC substrate 10 includes a high carbon concentration region (region) 11 on the surface thereof.

The SiC substrate 10 is an $n^+$ single-crystal SiC substrate. For example, the SiC substrate 10 is a substrate of 4H—SiC whose surface is inclined at an off angle of 0.2 to 10 degrees with respect to the {0001} plane.

The n-type impurity contained in the SiC substrate 10 is, for example, N (nitrogen) and the impurity concentration of the n-type impurity is, for example, $5\times10^{18}$ cm$^{-3}$ or more and $1\times10^{20}$ cm$^{-3}$ or less. The thickness of the SiC substrate 10 is, for example, 100 µm or more and 400 µm or less.

The high carbon concentration region 11 has, when compared with other regions of the SiC substrate 10, a high interstitial carbon concentration. The interstitial carbon concentration has a negative correlation with a carbon vacancy concentration. Therefore, the high carbon concentration region 11 has, when compared with other regions of the SiC substrate 10, a low carbon vacancy concentration.

The carbon vacancy concentration and the $Z_{1/2}$ level density measured by DLTS (Deep Level Transient Spectroscopy) are positively correlated. The $Z_{1/2}$ level density in the high carbon concentration region 11 measured by DLTS is $1\times10^{11}$ cm$^{-3}$ or less.

The semiconductor substrate 100 according to the present embodiment is, for example, a semiconductor substrate used for fabricating a semiconductor substrate applicable to a PIN diode as a bipolar device.

The n-type SiC has a disadvantage that when compared with, for example, n-type Si, the life time of minority carriers (holes) is short. If the life time of minority carriers is short, in the case of, for example, a bipolar device in which the n-type SiC is used for the drift layer, conductivity modulation is insufficient and it is difficult to reduce the on resistance of the device.

As a factor of the short life time of minority carriers, carbon vacancy in the n-type SiC can be considered. That is, the carbon vacancy acts as a killer center of holes, reducing the life time of holes. Therefore, the life time of holes can be considered to be prolonged by reducing the carbon vacancy in the n-type SiC.

Figure 2A:
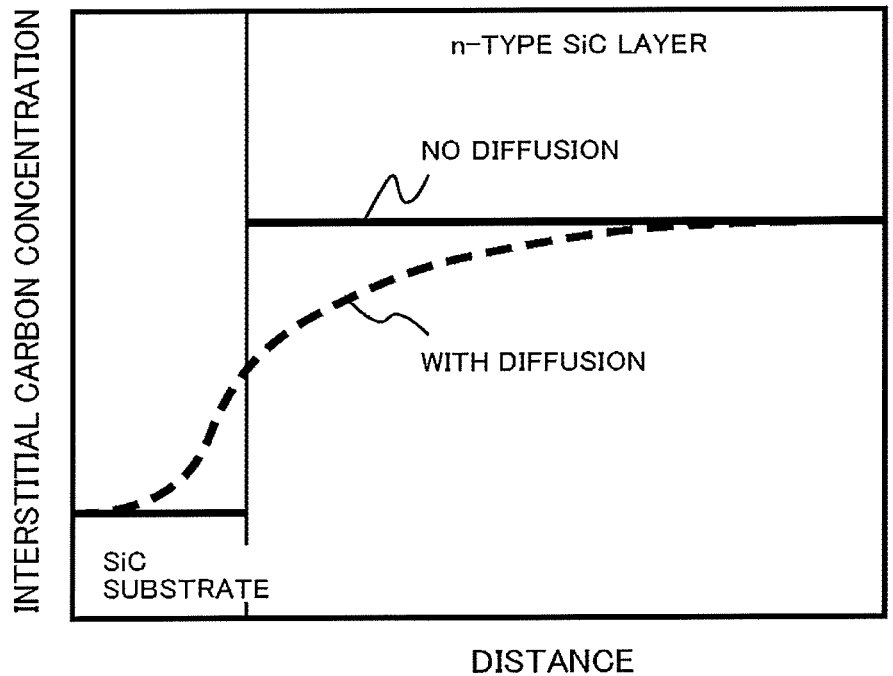
FIGS. 2A and 2B are diagrams illustrating functions of the semiconductor substrate according to the first embodiment.
Figure 2B:
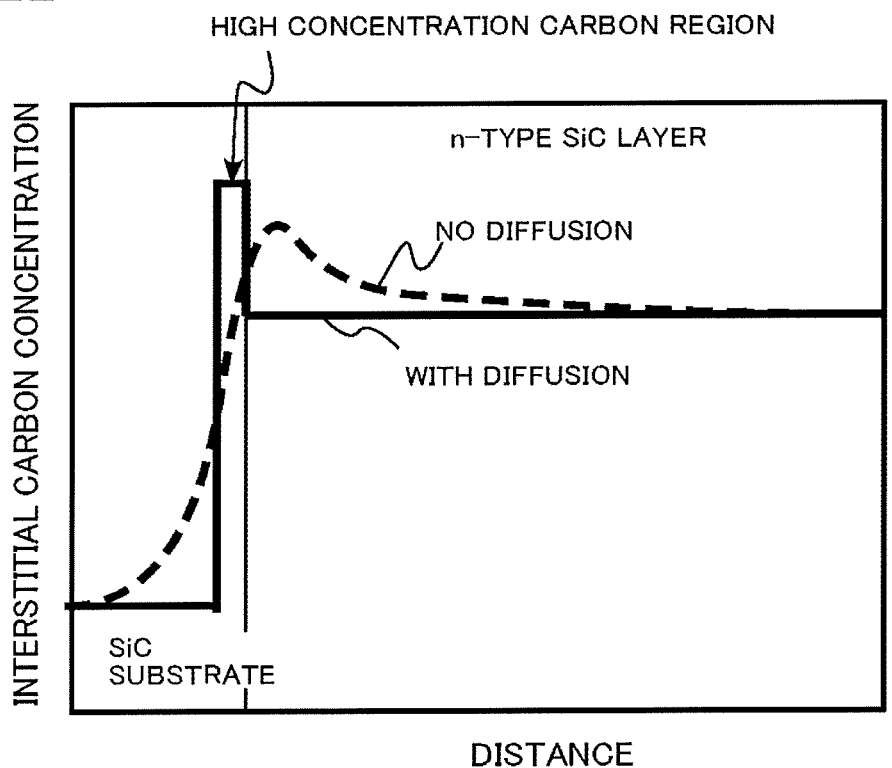

FIGS. 2A and 2B are diagrams illustrating functions of the semiconductor substrate according to the present embodiment. FIG. 2A is a case when an n-type SiC layer is formed on an SiC substrate having no high carbon concentration region by the epitaxial growth method and FIG. 2B is a case when an n-type SiC layer is formed on an SiC substrate having a high carbon concentration region by the epitaxial growth method. For each case, the distribution of interstitial carbon concentration in the thickness direction of an SiC substrate is separately shown for a case when thermal diffusion during epitaxial growth is not considered (no thermal diffusion) and a case when thermal diffusion is considered (with thermal diffusion).

An n-type SiC layer used for the drift layer of a bipolar device is generally formed on a single-crystal SiC substrate fabricated by undergoing a high-temperature process of 1700° C. or higher such as the sublimation method, high-temperature CVD (Chemical Vapor Deposition) method or the like by using the epitaxial growth method. The interstitial carbon concentration depends on the formation temperature of SiC and an SiC substrate fabricated at high temperature has a low interstitial carbon concentration. In other words, the interstitial carbon concentration depends on the formation temperature of SiC and an SiC substrate fabricated at high temperature has a high carbon vacancy concentration. In general, the epitaxial growth temperature of an n-type SiC layer is lower than the formation temperature of the SiC substrate.

A solid line (no diffusion) in FIG. 2A indicates the distribution of interstitial carbon concentration when it is assumed that interstitial carbon does not diffuse by heat treatment during formation of the n-type SiC layer or thereafter. The interstitial carbon concentration of the n-type SiC layer formed at a lower temperature than the SiC substrate becomes higher.

In reality, however, as indicated by a dotted line (with diffusion) in FIG. 2A, interstitial carbon is diffused by heat treatment during formation of the n-type SiC layer or thereafter to generate a concentration gradient. At this point, carbon vacancy is similarly diffused to generate a concentration gradient.

Interstitial carbon in the n-type SiC layer is diffused toward the SiC substrate where the interstitial carbon concentration is low during formation of the n-type SiC layer and the interstitial carbon concentration in the n-type SiC layer is decreased. Particularly the interstitial carbon concentration on the side of the SiC substrate of the n-type SiC layer is decreased. In other words, the carbon vacancy on the side of the SiC substrate of the n-type SiC layer is increased.

On the other hand, in the present embodiment, as shown in FIG. 2B, a high carbon concentration region where the interstitial carbon concentration is high is present on the surface of the SiC substrate. Thus, interstitial carbon in the high carbon concentration region is diffused toward the side of the n-type SiC layer during formation of the n-type SiC layer and the interstitial carbon concentration in the n-type SiC layer is increased. Particularly the interstitial carbon concentration on the side of the SiC substrate of the n-type SiC layer is increased. In other words, the carbon vacancy on the side of the SiC substrate of the n-type SiC layer is decreased.

Thus, if an n-type SiC layer is formed by the epitaxial growth method using the semiconductor substrate 100 according to the present embodiment, the carbon vacancy concentration in the n-type SiC layer can be reduced. Therefore, the life time of minority carriers in the n-type SiC layer, that is, holes can be improved.

(Modification)

Figure 3:
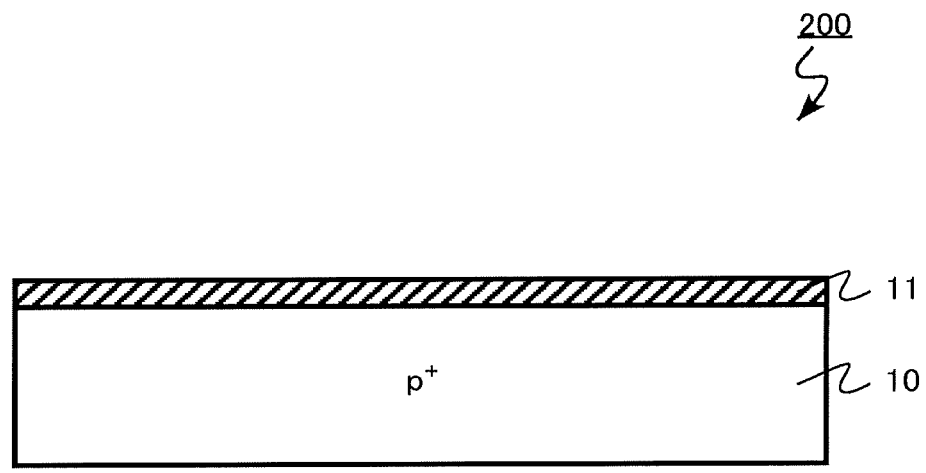
FIG. 3 is a schematic sectional view of a semiconductor substrate according to a modification of the first embodiment.

FIG. 3 is a schematic sectional view of a semiconductor substrate according to a modification of the present embodiment. A semiconductor substrate 200 is different from the semiconductor substrate 100 in the first embodiment in that the SiC substrate 10 is a p⁺ type single-crystal SiC substrate.

The p-type impurity in the SiC substrate 10 is, for example, Al (aluminum) and the impurity concentration of the p-type impurity is, for example, $5 \times 10^{18}$ cm$^{-3}$ or more and $1 \times 10^{20}$ cm$^{-3}$ or less.

The semiconductor substrate 200 according to the present embodiment is, for example, a semiconductor substrate used for fabricating a semiconductor substrate applicable to vertical IGBT (Insulated Gate Bipolar Transistor) as a bipolar device.

If an n-type SiC layer is formed by the epitaxial growth method using the semiconductor substrate 200 according to the present embodiment, like in the first embodiment, the carbon vacancy concentration in the n-type SiC layer can be reduced. Therefore, the life time of minority carriers in the n-type SiC layer can be improved.

Second Embodiment

In a method for fabricating a semiconductor substrate according to the present embodiment, an SiC substrate is grown by the vapor growth and C (carbon) is introduced into the SiC substrate to form an n-type SiC layer on the SiC substrate by the epitaxial growth method. The method for fabricating a semiconductor substrate according to the present embodiment is a fabricating method using a semiconductor substrate in the first embodiment. Therefore, the description of content overlapping with the content in the first embodiment is omitted. The semiconductor substrate according to the present embodiment is a semiconductor substrate fabricated by using the above fabricating method.

Figure 4:
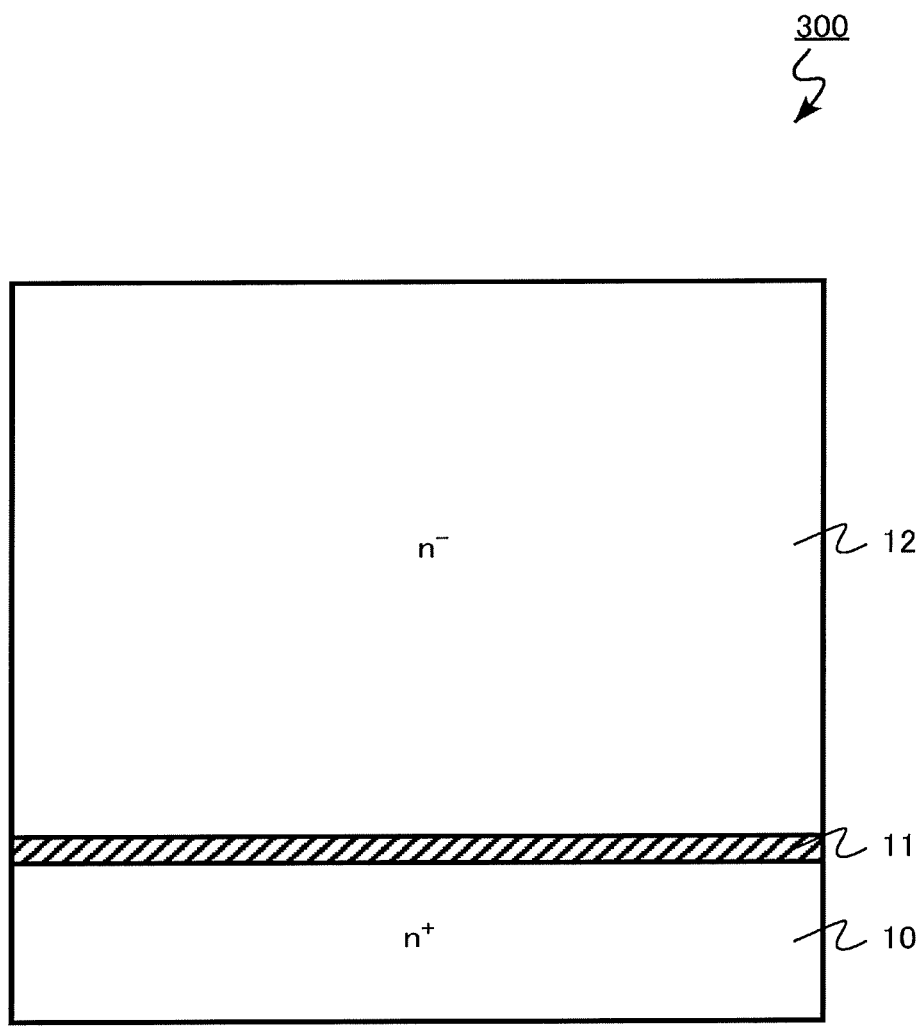
FIG. 4 is a schematic sectional view of a semiconductor substrate according to a second embodiment.

FIG. 4 is a schematic sectional view of a semiconductor substrate according to the present embodiment. A semiconductor substrate 300 includes the SiC substrate 10 and an n-type SiC layer 12 on the SiC substrate 10. The high carbon concentration region 11 is provided in a portion of the SiC substrate 10 in contact with the n-type SiC layer 12.

The SiC substrate 10 is an n⁺ single-crystal SiC substrate. For example, the SiC substrate 10 is a substrate of 4H—SiC whose surface is inclined at an off angle of 0.2 to 10 degrees with respect to the {0001} plane.

The n-type impurity contained in the SiC substrate 10 is, for example, N (nitrogen) and the impurity concentration of the n-type impurity is, for example, $5 \times 10^{18}$ cm$^{-3}$ or more and $1 \times 10^{20}$ cm$^{-3}$ or less. The thickness of the SiC substrate 10 is, for example, 100 µm or more and 400 µm or less.

The high carbon concentration region 11 has, when compared with other regions of the SiC substrate 10, a high interstitial carbon concentration. The interstitial carbon concentration has a negative correlation with a carbon vacancy concentration. Therefore, the high carbon concentration region 11 has, when compared with other regions of the SiC substrate 10, a low carbon vacancy concentration.

The carbon vacancy concentration and the $Z_{1/2}$ level density measured by DLTS (Deep Level Transient Spectroscopy) are positively correlated. The $Z_{1/2}$ level density in the high carbon concentration region 11 measured by DLTS is $1\times10^{11}$ cm$^{-3}$ or less.

The n-type SiC layer 12 contains, for example, N (nitrogen) as an n-type impurity. The impurity concentration of the n-type impurity of the n-type SiC layer 12 is lower than that of the n-type impurity of the SiC substrate 10. The impurity concentration of the n-type impurity of the n-type SiC layer 12 is, for example, $1\times10^{15}$ cm$^{-3}$ or more and $5\times10^{16}$ cm$^{-3}$ or less.

The thickness of the n-type SiC layer 12 is, for example, 5 μm or more and 200 μm or less. From the viewpoint of using for fabricating high-breakdown devices, the thickness of the n-type SiC layer 12 is desirably 50 μm or more and more desirably 100 μm.

The semiconductor substrate 300 according to the present embodiment is, for example, a semiconductor substrate used for fabricating a PIN diode as a bipolar device.

Next, the method for fabricating a semiconductor substrate according to the present embodiment will be described with reference to FIG. 4.

First, the SiC substrate 10 is formed by the vapor growth. The vapor growth is, for example, the sublimation method or the high-temperature CVD method. From the viewpoint of improving throughput of fabrication by increasing the growth speed, the formation temperature of the SiC substrate 10 is desirably 1700° C. or higher, more desirably 1800° C. or higher, and most desirably 1900° C. or higher. If the formation temperature of the SiC substrate 10 is high, the concentration of interstitial carbon in the SiC substrate 10 decreases and the concentration of carbon vacancy increases.

Next, C (carbon) is introduced into the surface of the SiC substrate 10 to form the high carbon concentration region 11. The high carbon concentration region 11 is formed by ion implantation of C (carbon).

From the viewpoint of improving crystallinity of the n-type SiC layer 12 formed later by the epitaxial growth method, it is desirable to reduce damage by ion implantation on the surface of the SiC substrate 10 after the ion implantation as much as possible. From the above viewpoint, it is desirable to control a projected range (Rp) during ion implantation of C (carbon). That is, it is desirable to set acceleration energy such that the position of Rp±3σ where the concentration of ions is two orders of magnitude lower than the peak concentration is on the inner side from the surface of the SiC substrate 10. It is more desirable to set acceleration energy such that the position of Rp±4.8σ where the concentration of ions is five orders of magnitude lower than the peak concentration is on the inner side from the surface of the SiC substrate 10.

From a similar viewpoint, it is desirable to perform ion implantation in a state in which the surface of the SiC substrate 10 is exposed without an oxide film such as a through film being provided on the surface of the SiC substrate 10 so that the projected range (Rp) during ion implantation of (carbon) is positioned in a deeper position of the substrate with the same amount of acceleration energy.

Next, the n-type SiC layer 12 is formed on the SiC substrate 10 by the epitaxial growth method. The n-type SiC layer 12 is formed on the surface on the side of the high carbon concentration region 11 of the SiC substrate 10.

From the viewpoint of reducing carbon vacancy, the formation temperature when the n-type SiC layer 12 is formed is desirably lower than that of the SiC substrate 10.

The formation temperature is, for example, 1550° C. or higher and 1650° C. or lower.

The material gas of Si (silicon) when the n-type SiC layer 12 is formed is, for example, mono-silane (SiH$_4$) using a hydrogen gas (H$_2$) as a carrier gas. Also, the material gas of C (carbon) is formed is, for example, propane (C$_3$H$_8$) using a hydrogen gas as a carrier gas. Also, the material gas of N (nitrogen) as an n-type impurity is formed is, for example, a nitrogen gas (N$_2$) diluted by a hydrogen gas.

The thickness of the n-type SiC layer 12 to be formed is, for example, 50 μm.

According to the method for fabricating a semiconductor substrate in the present embodiment, the carbon vacancy concentration of the n-type SiC layer 12 is reduced by introducing C (carbon) into the surface of the SiC substrate 10 to form the high carbon concentration region 11. Therefore, the semiconductor substrate 300 in which the life time of minority carriers is improved can be fabricated. Then, by using the semiconductor substrate 300 according to the present embodiment, a bipolar device that reduces on resistance can be fabricated.

The method for fabricating a semiconductor substrate according to the present embodiment is effective in reducing carbon vacancy when particularly a thick n-type SiC layer for high-breakdown devices is formed because interstitial carbon is introduced into the n-type SiC layer from the side of the SiC substrate 10.

The method for introducing C (carbon) into the surface of the SiC substrate 10 may be a method that diffuses C (carbon) from a carbon containing film into the SiC substrate 10 by forming the carbon containing film on the surface of the SiC substrate 10 and heat-treating the carbon containing film. As the carbon containing film, for example, a carbon film formed by a sputtering process or a film carbonized by heat-treating a photo resist can be applied.

(Modification)

Figure 5:
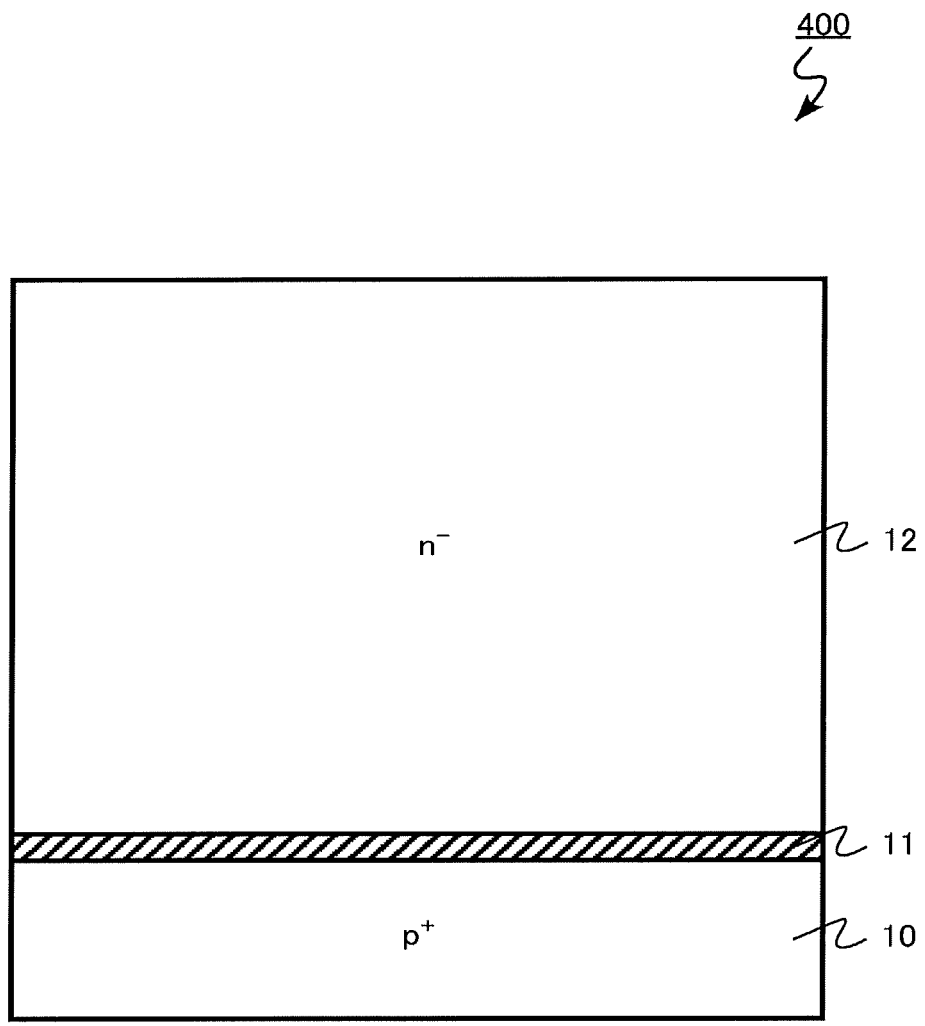
FIG. 5 is a schematic sectional view of a semiconductor substrate according to a modification of the second embodiment.

FIG. 5 is a schematic sectional view of a semiconductor substrate according to a modification of the present embodiment. A semiconductor substrate 400 is different from the semiconductor substrate 200 in the second embodiment in that the SiC substrate 10 is a p$^+$ type single-crystal SiC substrate.

The p-type impurity in the SiC substrate 10 is, for example, Al (aluminum) and the impurity concentration of the p-type impurity is, for example, $5\times10^{18}$ cm$^{-3}$ or more and $1\times10^{20}$ cm$^{-3}$ or less. The impurity concentration of the n-type impurity of the n-type SiC layer 12 is lower than that of a p-type impurity of the SiC substrate 10.

The semiconductor substrate 400 according to the present embodiment is, for example, a semiconductor substrate used for fabricating a vertical IGBT as a bipolar device.

Third Embodiment

The method for fabricating a semiconductor substrate according to the present embodiment is the same as that in the second embodiment except that C (carbon) is selectively introduced into the surface of an SiC substrate. In addition, a semiconductor substrate according to the present embodiment is the same as that in the second embodiment except that the above region is selectively provided on the surface of an SiC substrate. Therefore, the description of content overlapping with the content in the second embodiment is omitted.

Figure 6:
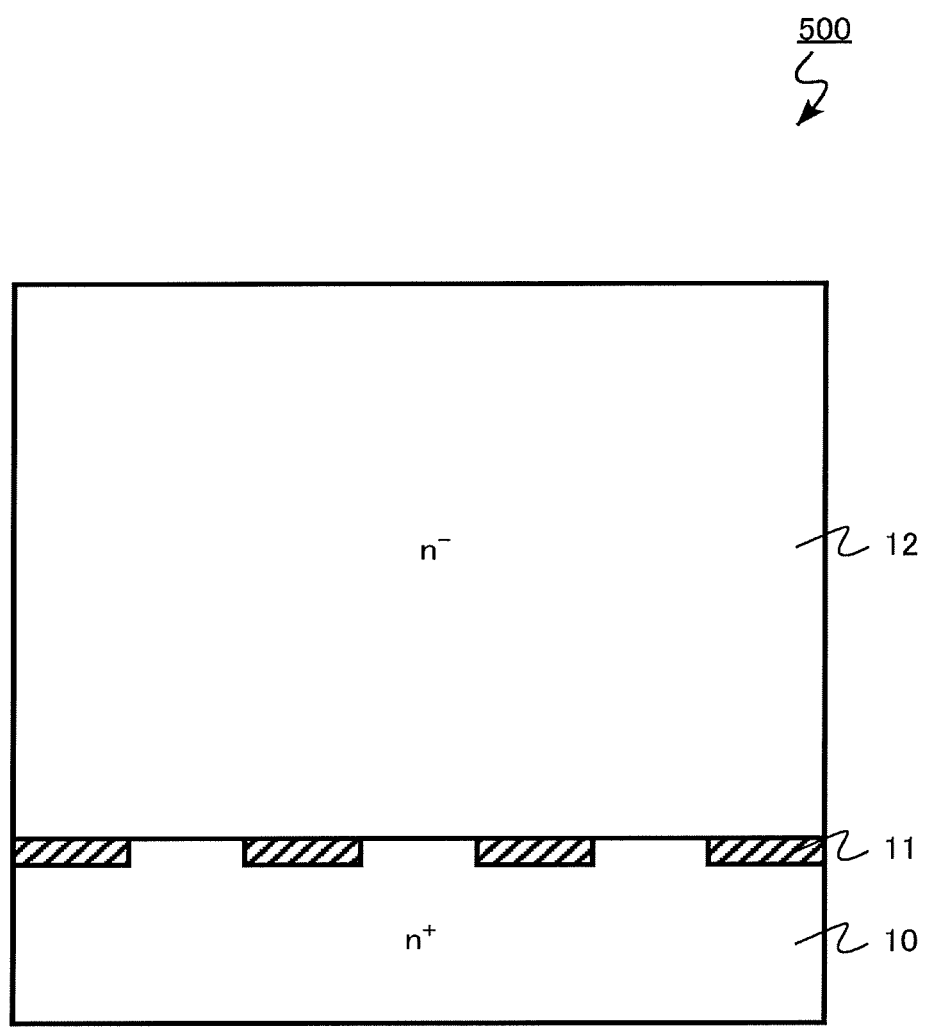
FIG. 6 is a schematic sectional view of a semiconductor substrate according to a third embodiment.

FIG. 6 is a schematic sectional view of a semiconductor substrate according to the present embodiment. A semiconductor substrate 500 includes the SiC substrate 10 and the n-type SiC layer 12 on the SiC substrate 10. The high carbon concentration region 11 is provided in a portion of the SiC substrate 10 in contact with the n-type SiC layer 12.

The high carbon concentration region 11 is selectively provided on the side of the SiC substrate 10 of the interface between the SiC substrate 10 and the n-type SiC layer 12. In other words, the n-type SiC layer 12 is in contact with other portions other than the high carbon concentration region 11 of the SiC substrate 10.

Figure 7:
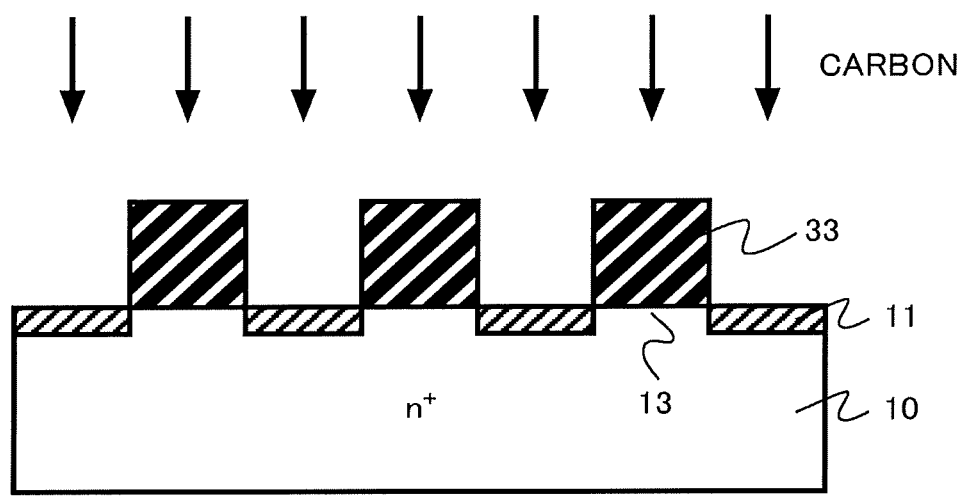
FIG. 7 is a schematic sectional view of the semiconductor substrate while being fabricated by a method for fabricating the semiconductor substrate according to the third embodiment.

Next, the method for fabricating a semiconductor substrate according to the present embodiment will be described with reference to FIGS. 6 and 7. FIG. 7 is a schematic sectional view of the semiconductor substrate while being fabricated by the method for fabricating the semiconductor substrate according to the present embodiment.

When C (carbon) is introduced into the surface of the SiC substrate 10 by ion implantation, in contrast to the second embodiment, the ion implantation is performed into the surface of the SiC substrate 10 by using a patterned mask material 33 as a mask. The mask material 33 is, for example, a photo resist.

After the mask material being removed after the ion implantation, the n-type SiC layer 12 is formed.

According to the method for fabricating a semiconductor substrate in the present embodiment, when the n-type SiC layer 12 is formed by epitaxial growth, in addition to the high carbon concentration region 11, a low carbon concentration region 13 where the carbon concentration is low and no damage is done by ion implantation is present on the surface of the SiC substrate 10.

The n-type SiC layer 12 superior in crystallinity can be formed by growing the n-type SiC layer 12 or the low carbon concentration region 13 good in crystallinity as a seed.

Devices superior in characteristics can be fabricated by using the semiconductor substrate 500 according to the present embodiment.

Incidentally, effects of the present embodiment can also be obtained by using the method of diffusing C (carbon) from a carbon containing film into the SiC substrate 10 when C (carbon) is introduced into the surface of the SiC substrate 10. It is easier to form the n-type SiC layer 12 good in crystallinity on the surface of the SiC substrate 10 in which the carbon concentration is low than on the surface of the SiC substrate 10 in which the carbon concentration is high. By patterning the carbon containing film before heat treatment, C (carbon) can selectively be introduced into the surface of the SiC substrate 10.

Fourth Embodiment

A semiconductor device according to the present embodiment includes a semiconductor substrate according to the second embodiment. Therefore, the description of content overlapping with the content in the second embodiment is omitted.

Figure 8:
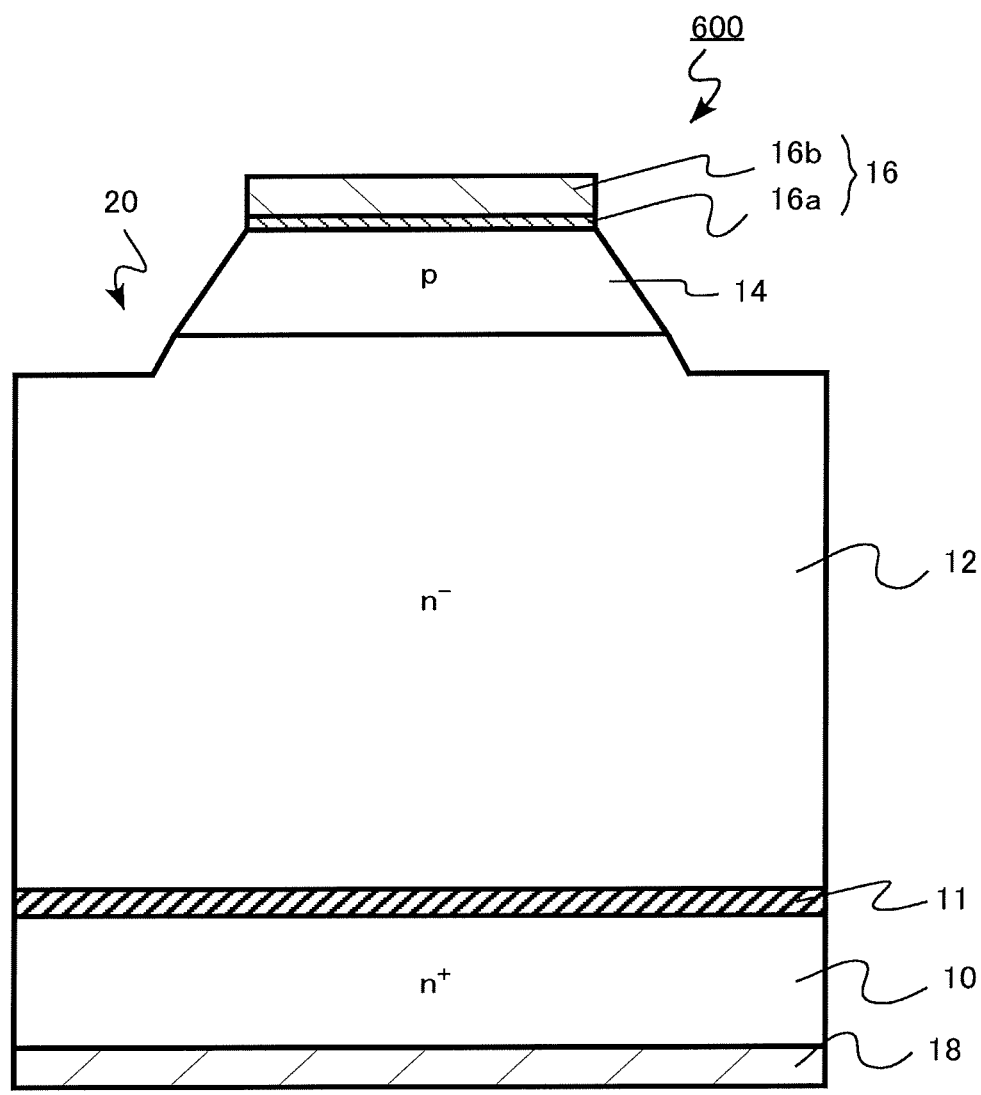
FIG. 8 is a schematic sectional view of a semiconductor device according to a fourth embodiment.

FIG. 8 is a schematic sectional view of a semiconductor device according to the present embodiment. A semiconductor device 600 according to the present embodiment is a mesa PIN diode.

The PIN diode 600 includes the SiC substrate 10. The SiC substrate 10 is an n$^+$ single-crystal SiC substrate. For example, the SiC substrate 10 is a substrate of 4H—SiC whose surface is inclined at an off angle of 0.2 to 10 degrees with respect to the {0001} plane.

The n-type SiC layer 12 is formed on the SiC substrate 10. The n-type SiC layer 12 is an epitaxial growth layer. The n-type SiC layer 12 is a drift layer of the PIN diode 600. The high carbon concentration region 11 is provided in a portion of the SiC substrate 10 in contact with the n-type SiC layer 12.

The n-type SiC layer 12 contains, for example, N (nitrogen) as an n-type impurity. The impurity concentration of the n-type SiC layer 12 is, for example, $1 \times 10^{15}$ cm$^{-3}$ or more and $5 \times 10^{16}$ cm$^{-3}$ or less. The thickness of the n-type SiC layer 12 is, for example, 5 µm or more and 200 µm or less.

A p-type SiC layer 14 containing a p-type impurity is formed on the n-type SiC layer 12. The p-type SiC layer 14 is an epitaxial growth layer.

The p-type SiC layer 14 contains, for example, Al (aluminum) as a p-type impurity and the impurity concentration thereof is $1 \times 10^{16}$ cm$^{-3}$ or more and $1 \times 10^{22}$ cm$^{-3}$ or less. The thickness of the p-type SiC layer 14 is, for example, 0.2 µm or more and 3 µm or less.

Then, the PIN diode includes a conductive anode electrode 16 electrically connected to the p-type SiC layer 14. The anode electrode 16 is formed of, for example, a barrier metal layer 16a of Ni (nickel) and an metal layer 16b of Al (aluminum) on the barrier metal layer 16a.

In addition, a conductive cathode electrode 18 is formed on the back side of the SiC substrate 10. The cathode electrode 18 is, for example, Ni (nickel).

The PIN diode 600 is provided with a groove portion 20 provided on both sides of the anode electrode 16 and reaching the n-type SiC layer 12 from the surface of the p-type SiC layer 14. The groove portion 20 is filled with, for example, an oxide film (not shown). By providing the groove portion 20, the high-breakdown PIN diode 600 that reduces a leak current can be realized.

In the semiconductor device according to the present embodiment, carbon vacancy in the n-type SiC layer 12 to be a drift layer is reduced. Therefore, the life time of holes in the n-type SiC layer 12 is prolonged and the PIN diode 600 of low on resistance can be realized.

In the above embodiments, a case of 4H—SiC as the crystal structure of silicon carbide is taken as an example, but the embodiments can also be applied to other crystal structures such as 6H—SiC and 3C—SiC.

The embodiments have been described by taking a PIN diode as an example of the bipolar device, but the embodiments can also be applied to other bipolar devices such as IGBT (Insulated Gate Bipolar Transistor) and BJT (Bipolar Junction Transistor) in which an n-type SiC layer is used for the drift layer.

While certain embodiments have been described, these embodiments have been presented by way of example only, and are not intended to limit the scope of the inventions. Indeed, the method for fabricating the semiconductor substrate, the semiconductor substrate, and the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
    an SiC substrate having a first region and a second region, the first region provided on a first part of an SiC substrate surface, the second region provided on a second part of the SiC substrate surface, a $Z_{1/2}$ level density measured by DLTS (Deep Level Transient Spectroscopy) in the first region being $1 \times 10^{11}$ cm$^{-3}$ or less, a $Z_{1/2}$ level density measured by DLTS in the second region being more than $1\times10^{11}$ cm$^{-3}$; and an n-type SiC layer provided on the SiC substrate, the n-type SiC layer having an impurity concentration of an n-type impurity lower than an impurity concentration of the n-type impurity or a p-type impurity of the SiC substrate, wherein the first region and the second region are in direct contact with the SiC layer, and wherein the impurity concentration of the n-type or p-type impurity in the SiC substrate is $5\times10^{18}$ cm$^{-3}$ or more.

2. The device according to claim 1, wherein a thickness of the n-type SiC layer is 50 μm or more.

3. The device according to claim 1, wherein the first region is selectively provided on a side of the SiC substrate of an interface between the SiC substrate and the n-type SiC layer.

* * * * *